United States Patent [19]

Fjarlie et al.

[11] 3,927,383

[45] Dec. 16, 1975

[54] LOW NOISE WIDE BAND TRANSDUCER SYSTEM

[75] Inventors: Earl John Fjarlie, Dollard des Ormeaux; Thomas Doyle, Montreal; Melvin John Teare, Pierrefonds, all of Canada

[73] Assignee: RCA Corporation, New York, N.Y.

[22] Filed: Aug. 20, 1974

[21] Appl. No.: 498,965

Related U.S. Application Data

[63] Continuation-in-part of Ser. No. 246,469, April 21, 1972, abandoned.

[52] U.S. Cl. ..................... 330/59; 330/35; 330/103

[51] Int. Cl.² .......................................... H03F 17/00

[58] Field of Search ......... 330/59, 27, 104, 35, 103; 307/235

[56] References Cited

UNITED STATES PATENTS

| | | | |
|---|---|---|---|
| 2,245,598 | 6/1941 | Llewellyn | 330/104 X |
| 2,652,458 | 9/1953 | Miller, Jr. | 330/104 X |
| 3,111,630 | 11/1963 | Wolcott | 330/104 X |
| 3,223,938 | 12/1965 | Brook | 330/59 X |
| 3,240,944 | 3/1966 | Wolfson et al. | 250/214 |
| 3,335,228 | 8/1967 | Thompson et al. | 330/59 X |
| 3,412,342 | 11/1968 | Tonnessen | 330/104 X |
| 3,437,943 | 4/1969 | Mader | 330/59 X |

*Primary Examiner*—Nathan Kaufman
*Attorney, Agent, or Firm*—Edward J. Norton; Joseph D. Lazar

[57] ABSTRACT

A transducer system of wave energy including both acoustical and electromagnetic wave energy in the visible and infrared range comprising a transducer such as a photo sensitive detector having a load resistor coupled to an amplifier which is arranged to operate at substantial unity gain. Positive and negative feedback is utilized to improve the bandwidth without degrading the noise performance. The SNR is substantially constant at the higher frequencies.

8 Claims, 6 Drawing Figures

LOW NOISE WIDE BAND TRANSDUCER SYSTEM

CROSS-REFERENCE TO COPENDING APPLICATIONS

This application is a continuation-in-part of parent application, Ser. No. 246,469, filed Apr. 21, 1972 now abandoned.

BACKGROUND OF THE INVENTION

1. Field of the Invention

This invention relates to amplifiers of wave energy signals and more particularly to wave energy detector amplifiers of broad bandwidth and stabilized sensitivity.

2. Description of the Prior Art

Amplifiers and preamplifiers of signals detected by transducers, particularly photo transducers, inherently include noise that affects the signal to noise ratio (SNR) of the system. Transducers such as germanium and silicon photodiodes, pyroelectric detectors, hydrophones or microphones, have a capacitance as their dominant impedance term. It is well known that the bandwidth of an amplifier can be made to be inversely proportional to the input capacitance and the load resistance of the transducer. It is desirable, therefore, to reduce the effective input capacitance as well as to reduce the load resistance to improve the bandwidth of such amplifying systems. These reductions however, affect both the noise performance and the response of the system. Accordingly, there is a need for circuit means which affect the reduction without degrading the signal to noise (SNR) of the system.

A number of circuit arrangements have heretofore been devised to neutralize the effects brought about by the input capacitances particularly in the low signal voltage input levels as well as reducing the effective load resistance. In general, these prior art circuit arrangements provide a feedback signal to prevent multiplication of the interelectrode capacitances of the amplifier but do not neutralize the input capacitances to the amplifier developed across the signal detecting transducer or inherently within such transducers. FIG. 1 is an example of such a circuit, to be described in greater detail hereafter. Previous attempts to reduce the effective load resistance of the transducer load impedance to enhance bandwidth have decreased the signal to noise (SNR) of the system.

SUMMARY OF THE INVENTION

According to the present invention the total input capacitance of an amplifier or preamplifier of signals from a transducer of electromagnetic radiation is substantially neutralized by positive feedback signals from the amplifier coupled to its input. The total input capacitance includes distributed and inherent capacitances of the transducer, comprising usually a photodiode and its load impedance, and the amplifier components. The effective resistance of the load impedance is also reduced by negative feedback from the amplifier coupled thereto. The bandwidth of a system thereby is extended to significantly higher frequencies with either no change in the system's SNR or a choice of the amount of reduction in exchange for the increased bandwidth.

DETAILED DESCRIPTION OF PREFERRED EMBODIMENTS

Figure 1:
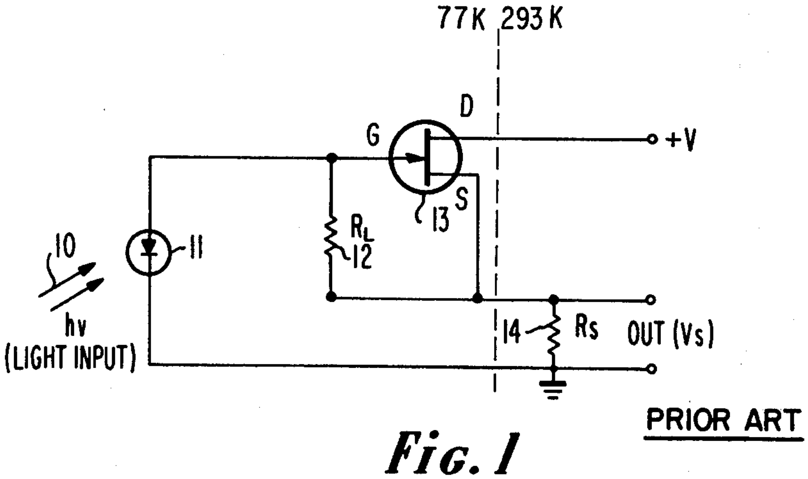
FIG. 1 PRIOR ART
FIG. 1 is a schematic of a prior art circuit provided with positive feedback.

This invention provides means for improving the electrical frequency bandwidth of a transducer-preamplifier system without degrading the noise performance of that system. The conventional technique for bandwidth enhancement usually provides for an equalizing network, such as a differentiator, after the preamplifier or, a network in the feedback loop which emphasizes certain frequencies. Such circuits can degrade the SNR of the system and are unsatisfactory for extending the bandwidth of the system while maintaining a good response and NEP established by the system alone.

It is known that certain types of transducers such as photodiodes, pyroelectric detectors, hydrophones, or microphones, have a capacitance as their dominant impedance term. The load resistance for the transducer together with the capacitance of the transducer determines the electrical frequency bandwidth of the system by means of the RC time constant of the combination of the load and the transducer. The examples below are given with typical values for a germanium photodiode. FETs, which have as the light sensitive area, the gate source diode, also may give improved performance utilizing this principle. The noise which limits the performance of the system is contributed by the transducer or the load or the combination of the two together. The amplifier noise contribution is made negligible by the design choices as will be described below.

Transducers are usually analyzed as current generators, both from their signal and their noise viewpoints. Therefore, the detector or transducer noise is the current noise arising from leakage current or bias current in the device. Most commonly, this noise may be represented by the following relationship for shot noise in a current, $I_D$ (amperes):

$$I_D = \sqrt{2\, e\, I\, \Delta f} \quad (1)$$

where: $e$ is the electronic charge in coulombs, I is the leakage current in (A) amperes, and $\Delta f$ is the noise bandwidth in Hertz. Thus, in practice, if I is $10^{-11}$A, for a germanium diode cooled to 77°K, $\Delta f$ is 1 Hertz, and $e$ is $1.6 \times 10^{-19}$ coulombs, $I_D = 1.79 \times 10^{-15}$A, which is the shot noise current. Such a shot noise current flowing into a 100 Mohm resistor yields a voltage of $0.179\mu$V, that is required to be amplified.

The leakage current (I) is customarily the dominant noise generator in any system of the type useful in practicing this invention. However, this resultant noise contributed by the detector ($I_D$) can be made smaller than the thermal agitation noise current (Johnson noise) contributed by the detector load ($I_R$) by cooling the detector, in the case of germanium photodiodes, by choosing a small load resistor, or by proper fabrication of the detector for silicon photodiodes, pyroelectric detectors, hydrophones, and microphones. The current due to this Johnson noise in the load is given by:

$$I_R = \sqrt{\frac{4KT\Delta f}{R_L}} \qquad (2)$$

where: K is Boltzmann's constant, $1.38 \times 10^{-23}$J $K^{-1}$, T is the temperature in °K, $\Delta f$, is the noise bandwidth in Hertz, and $R_L$ is the resistance in ohms. Thus, if $R_L$ is 100M ohms, $\Delta f$ is 1 Hertz, and T is 77°K, $I_R = 6.52 \times 10^{-15}$A. In this case the voltage for amplification is 0.652$\mu$V. Thus the noise generator from the load is the dominant term for the noise in this system.

In the usual arrangement of FIG. 1, it is not possible to improve the frequency bandwidth any further without changing the value of the components. When detector noise dominates any reduction in the value of $R_L$ to improve the $R_LC$ time constant ($\tau$) will degrade the noise performance according to Equation (2). If $I_D$ dominated the performance, the response would drop eventually as $R_L$ is decreased, allowing the $R_L$ noise to dominate and the SNR will become poorer. It is desirable however that the value of the component not be changed.

The prior art circuit shown in FIG. 1 is an embodiment of a positive feedback system. It is a source-follower FET in which there is positive feedback from the output to the input. The detector 11, senses photons (light energy) 10 within its spectral bandwidth and the resulting current develops a potential difference across the load resistance 12. It is this potential difference (the signal) which is amplified to produce the useable output, $V_s$, across the source resistance 14. The germanium detector 11, load resistor 12, and FET 13, are preferably cooled in order to reduce the noise so that a significant signal to noise ratio may be realized. When the system noise limit as indicated above is $I_R$, which is $6.52 \times 10^{-15}$A, the noise equivalent power (NEP) of the system is $8.76 \times 10^{-15}$W$Hz^{-1/2}$ at a spectral wavelength, $\lambda$, of 1.42 micrometers. This is based on the quantum efficiency for germanium being 0.65.

The operating conditions for the amplifier circuit of FIG. 1, as known in the art, may dictate and thereby require the value of the load resistance, $R_L$, to be independent of the noise condition requirement. Such design criteria are not necessarily determined by the analysis of the noise values that are being discussed herein. Thus, the operating point of the detector, the bias level, and other operating conditions must be considered in the initial design specification of the amplifier system. These conditions must still allow the load resistor to be chosen, nevertheless, so that the resulting noise limitation of the system does not prevent the required NEP from being attained. This NEP might be $10^{-14}$W$Hz^{-1/2}$, for example.

It is known that the NEP is the power required to produce an output signal equivalent to the output noise voltage. If the load resistance value is doubled, the output noise voltage from it increases by 1.414 times, and the output signal doubles for a constant power input thereby improving the NEP. However, it should be noted that the output noise voltage as established by the detector also doubles. Since $R_L$ has doubled, the response has doubled; there comes a point when further increases of $R_L$ do not improve the performance since the dominant noise has become detector noise.

As has been mentioned, the bandwidth of such a system is limited by the $R_LC$ constant of the detector and its load. Any attempt at improving the noise performance of the system, referring once again to the calculated examples of Johnson and shot noise currents $I_R$ and $I_D$, causes a degrading of the frequency bandwidth because $R_L$ has to be increased. As may be seen from the example, it is possible to increase $R_L$ to 1.33 gigaohms ($1.33 \times 10^9$ ohms) before the detector noise becomes the limiting contribution to the system. For this case the NEP is $3.42 \times 10^{-15}$W$Hz^{-1/2}$ taking the RMS value of the noise contribution due to $I_R$ as well the noise contribution due to $I_D$. All these calculations assume the noise contribution from the FET 13 is small compared to these noise values. Since low noise FETs are known, this assumption is practical and within the skill of the art. When the detector is fabricated properly, a load resistor can usually be found of the right size such that the noise currents $I_R$ and/or $I_D$ dominate the noise performance of the system, thus making the FET noise negligible for almost any FET that one would use.

Figure 2:
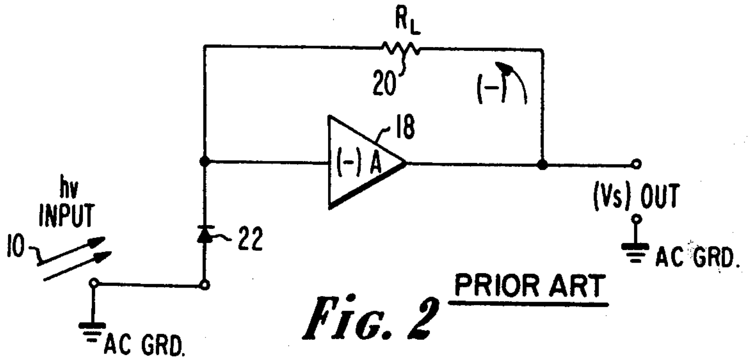
FIG. 2 PRIOR ART
FIG. 2 is a block diagram of a circuit provided with negative feedback.

It should be understood and appreciated that the feedback arrangement of FIG. 1 neutralizes only the gate-source capacitance of FET 13, but does not neutralize the capacitance of the detector 11. It is known that the bandwidth of a system may be improved by utilizing negative feedback to reduce the resistance of the load as is illustrated in FIG. 2. An amplifier 18 provides a negative feedback signal through $R_L$ resistor 20 to the input. A transducer 22 responds to the input light signal 10 to develop the input signal to the amplifier. This type of circuit causes a reduction of the input resistance but does not reduce the noise of the amplifier and the input transducer since the noise is determined by the physical size of the resistor. Feedback circuits normally are concerned it should be understood with enhancing bandwidth, minimizing distortion, or effecting a system change when the SNR is large. The use of feedback where noise performance is the significant problem has not been heretofore appreciated or understood.

According to the present invention, the bandwidth of a system may be improved without degrading the SNR, provided the noise limitation is established by the transducer itself, by utilizing positive feedback to neutralize the capacitance of the transducer and negative feedback to reduce the resistance of the load. If the resistor dominates the noise, the bandwidth enhancement comes at the expense of poorer NEP.

Figure 3:
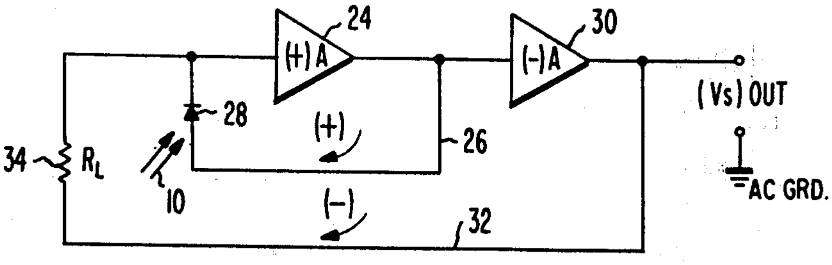
FIG. 3 is a block diagram of a circuit according to the invention providing positive and negative feedback to the input transducer and its load resistor.

FIG. 3 includes, in a functional schematic illustrating the principle of the invention, a first amplifier 24 providing a positive feedback signal over path 26 to transducer 28 receiving input light signals 10. A second amplifier 30 provides a negative feedback signal over path 32 to $R_L$ load resistor 34. Amplifier 24 is arranged to provide a gain less than unity but substantially near unity and serves to neutralize the capacitance of the detector transducer 28. Copending, commonly assigned patent application of M. J. Teare filed on even date herewith, entitled "Low Noise Detector Amplifier," now U.S. Pat. No. 3,801,933, issued Apr. 2, 1974, describes in detail an amplifier suitable for amplifier 24 herein which effects bandwidth enhancement by using positive feedback alone to a detector transducer.

The second amplifier 30 of FIG. 3 is provided with a finite gain and serves to reduce the effective resistance of load resistor 34 by negative feedback. The overall time constant for the system is reduced by the reduction of the effective load resistance 34. The effective value for $R_L$ reduced by the negative feedback may be represented by the relation: $(R_L)eff = R_l/\text{-}A$. Thus, the time constant which governs the bandwidth frequency becomes smaller by the factor A.

Restating the principle: if the resistance $R_L$ were physically reduced by a factor 10, the system noise voltage would decrease by a factor $\sqrt{10}$, unless the detector noise $I_D$ became dominant. Thus the SNR would degrade by the factor $\sqrt{10}$ unless detector noise dominates the performance. For such a case of dominant detector noise, SNR remains constant. In this case, shown as the circuit of FIG. 2, if the effective resistance is reduced by feedback, by a factor 10, the detector noise voltage is reduced by the same factor, but the signal is also reduced by the same factor so that the signal to noise ratio (SNR) remains fixed. In practice, if the noise limit is fixed by the physical size of $R_L$, the negative feedback will, by conventional design choices, be used to trade-off frequency bandwidth with SNR, whereby the final bandwidth is determined by the feedback performance. The design procedure is thus to provide a positive feedback circuit, wherein $R_L$ is increased until detector noise dominates the performance. The negative feedback circuit (path 32, FIG. 3) is adjusted to increase the negative factor to achieve the desired bandwidth. In practice, this usually is not possible due to bias interactions or impedance difficulties. The load noise ($I_R$) will dominate the performance and the NEP will be degraded. For a given system, the size of $R_L$ to achieve the condition wherein $I_D$ dominates can be prohibitively large from the viewpoint of frequency of operation. Thus, the negative feedback technique will allow the use of resistors large enough not to degrade initially the noise performance and still allow significantly greater bandwidth to be achieved than could be attained without the feedback loops.

In summary, the system with the feedback loops of FIG. 3 is operating with a certain SNR. If $R_L$ is decreased by a factor A, the noise from $R_L$ is decreased by the factor $\sqrt{A}$ and the SNR decreases by the factor $\sqrt{A}$ provided the noise is limited by the size of $R_L$. The reduction of $R_L$ improves the frequency bandwidth by the factor A; thus the designer has traded-off SNR for a broader frequency performance. If the noise is limited by the detector current (I) value, the effective reduction in $R_L$ does not affect SNR and the designer has improved the overall system performance, provided the following amplifier (not shown) receptive of ($V_s$) can use the smaller signal and smaller noise voltages without affecting the established SNR. For this latter case, the NEP remains constant with increasing frequency of operation until the noise of the following amplifier (such as amplifier 43 in FIG. 4 to be described) limits the noise performance.

When the resistance of $R_L$ is effectively decreased by the application of negative feedback, the noise from $R_L$ is unaffected, but the noise from the detector decreases by the same factor as the signal from the detector, i.e. the feedback factor, since these two currents ($I_D$ and $I_R$) appear as voltages across the effective value of $R_L$. The bandwidth is increased, but if the resistor noise ($I_R$) dominates, the increased bandwidth comes at the expense of poorer SNR. The resistor noise ($I_R$) will dominate provided that good quality detectors have been used and provided, further, the size of $R_L$ is 100M ohms or larger. A good quality detector is one having a leakage current (I) no more than $10^{-11}$ amperes. Increasing the size of $R_L$ for a better NEP performance causes a poorer frequency bandwidth, since the best noise performance occurs when $R_L$ is largest and $CR_L$ is greatest, C being the detector capacitance. Hence for a given value of $R_L$ whereby resistor noise dominates the positive feedback performance, it is possible that negative feedback to $R_L$ will allow an optimum system performance. In this case the load noise ($I_R$) still dominates the performance but the frequency bandwidth is further increased by the negative feedback factor. This is one application of negative feedback where increased bandwidth is traded for a lower response as known in the art heretofore. The other application of negative feedback is when detector noise dominates; the increased bandwidth is traded for lower response, but the NEP remains constant. What is necessary is for the following amplifier to be able to handle smaller signals than if there had been no feedback and this capability may turn out to be the system final limiting condition, limiting in the sense of preserving an NEP of $10^{-14}WHz^{-1/2}$, for example. The use of feedback according to the present invention achieves a greater frequency bandwidth by large factors in the order of $10^2$ to $10^4$ or greater without degrading the noise equivalent power (NEP) of the system.

Thus, heretofore, detector systems with an NEP of $10^{-14}$ Watt $Hertz^{-1/2}$ or better for germanium detector systems were not expected to have a frequency response beyond a few Hertz. In practicing the present invention a frequency response in thousands to tens of thousands of Hertz can be achieved while still maintaining the NEP of $10^{-14}W\ Hertz^{-1/2}$. The improved frequency response depends on the relative size of the noise sources, $I_D$ and $I_R$.

The limitation in frequency response eventually becomes the stray capacitance in the system and the distributed capacitance of the load resistance $R_L$, which may be minimized by shielding $R_L$ with a shield connected to the output circuit point. Because the system has a well established time constant, $R_LC$ ($\tau$), well beyond that for the ½-power point of the $1/f$- noise of the transducer, the noise and the signal output at greater frequencies is limited by the new frequency response. Thus, the NEP of the system will remain constant at greater frequencies even though the system response is steadily decreasing, a phenomenon commonly known as "rolling off." This occurs no matter what the system noise source is, as explained above. It is for this reason, it would appear, presumably, that this principle of negative feedback has not been heretofore appreciated.

It is thus to be understood that according to this invention, the noise equivalent power (NEP) of the system remains constant with the feedback arrangement until a frequency $f_w$ is reached where the noise limitation for the system becomes the "white" noise of the following amplifier which is coupled to the output of the input portion of the system. "White" noise is a term used in the art to refer to noise having a uniform frequency distribution. At frequency $f_w$, the SNR starts to degrade with further increases in frequency. The feedback techniques of the invention extend the system bandwidth as established at the "front end," i.e., the input portion ahead of the following amplifiers, by first ensuring that the transducer noise ($I_D$) limits the noise performance and by then arranging that the load noise ($I_R$) limits the performance. The final limitation is the noise of the next amplifier.

FIGS. 4–6

Figure 4:
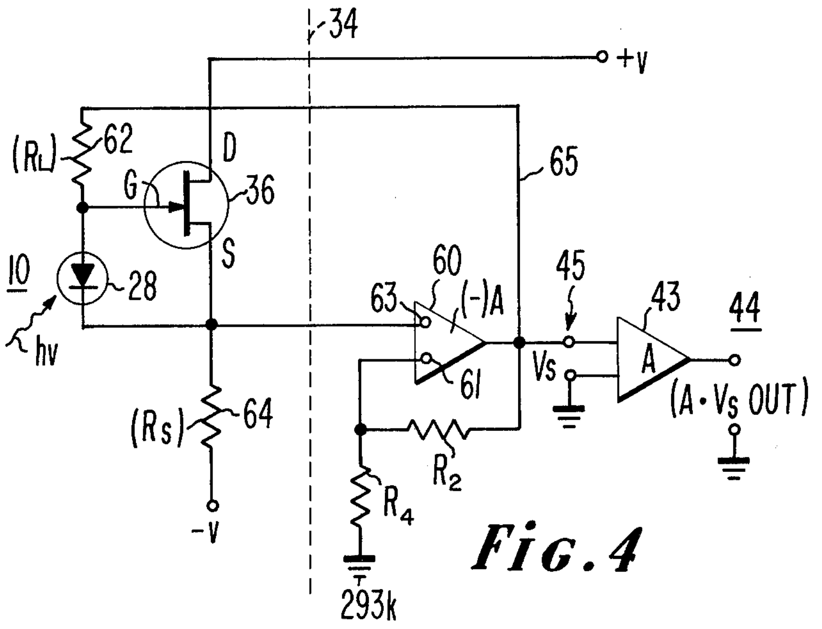
FIGS. 4 and 5 are detailed schematic diagrams of several embodiments of the invention.
Figure 6:
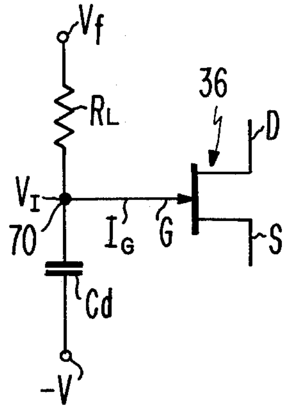
FIG. 6 is a schematic illustrating the principle of the invention.
Figure 5:
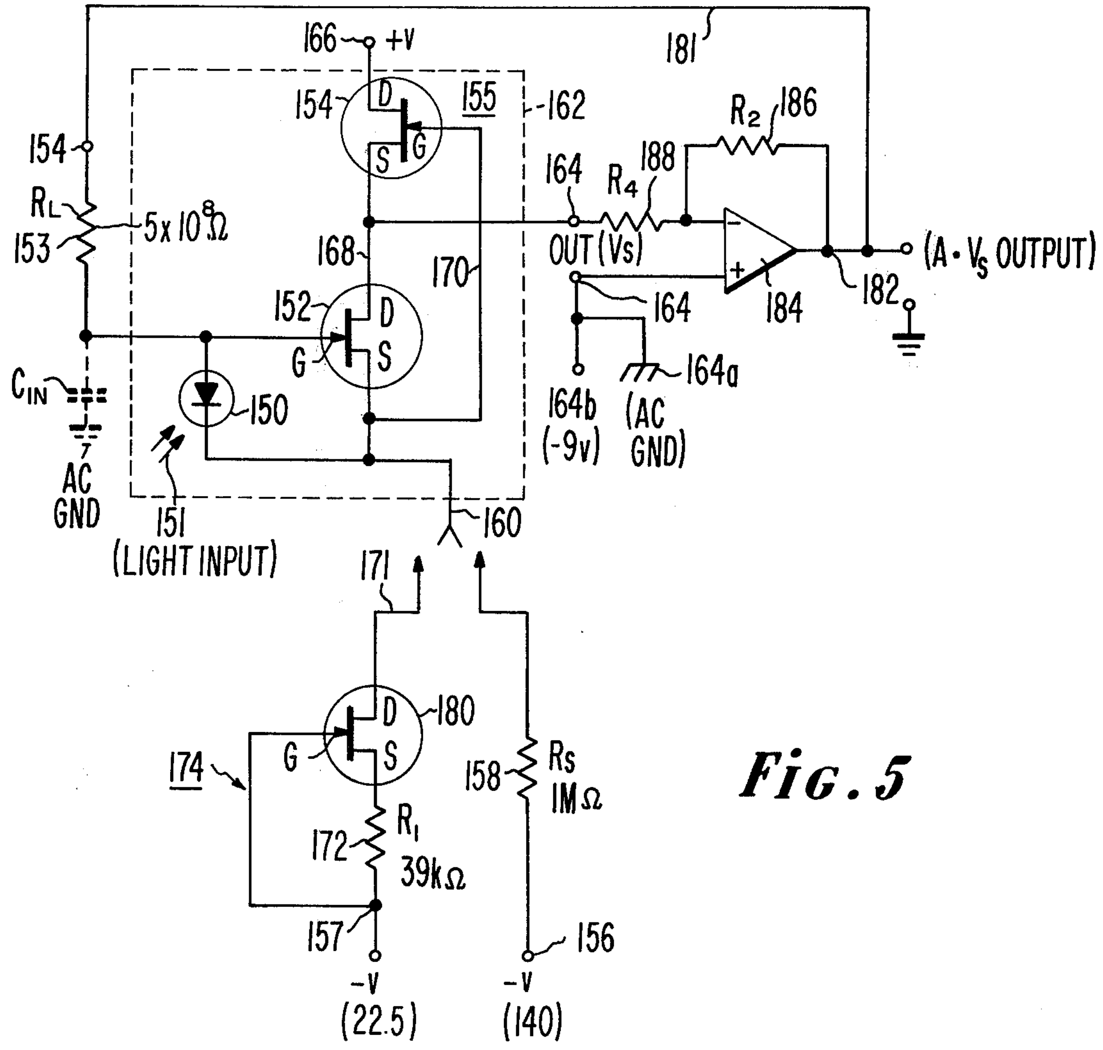

Several examples of circuits which embody the invention providing frequency enhancement while maintaining the system noise performance are shown in FIGS. 4 and 5. Before proceeding with a detailed description of the FIGS. 4–5, an analysis of a simplified equivalent circuit representing the capacitances of the detector ($C_d$), and the load resistor ($R_L$), will illustrate the principle of feedback according to the invention. The circuit is shown in FIG. 6, wherein the load resistor $R_L$ and the capacitances of the detector (including all capacitances in shunt therewith) $C_d$ are joined at terminal 70 which is connected to the gate (G) of an FET 36. The capacitances $C_d$ is connected to a voltage source −V while the resistor is connected to a negative feedback voltage $V_f$.

The potential at the junction 70 is initially, prior to feedback effects, $V_I$. The potential drop across $R_L$ is without negative feedback.

$$V_R = I_R R_L \quad (3)$$

Assume the negative feedback voltage $V_f$ affects the voltage $V_I$ at junction 70 to reduce it or tend to reduce it to a value $V_I'$. Thus, $$V_f = KV_I' \quad (4)$$

The potential drop $V_R$ is, with negative feedback, equal to:

$$V_R = V_I' - (-KV_I') \quad (5)$$

Substituting and rearranging:

$$I_R = \frac{V_I'}{R_L}(1 + K) \quad (6)$$

Equation (6) may be also represented by:

$$I_R = \frac{hI_G}{R_L}(1 + K) \quad (7)$$

where $I_G$ is the current of gate G of FET 36 and $1/h$ is the transconductance of the FET.

Thus the resistance of $R_L$ is reduced to $R_L/1+k$. Also the time constant $R_LC$ ($\tau$) of the circuit and consequently the system is reduced by the same factor.

From equation (7), the feedback factor (K) is:

$$K = \frac{R_L}{h} - 1 \quad (8)$$

In practice, an FET is chosen in circuit with $R_L$ such that $R_L/h>>1$.

The potential drop ($V_c$) across $C_d$ is:

$$V_c = I_c X_c \quad (9)$$

But the voltage $V_I$ at junction 70 will be increased slightly to a value $V_I'$ due to positive feedback by the positive feedback factor $\beta$. Thus:

$$V_c = V_I' - (\beta V_I') \quad (10)$$

Substituting and rearranging:

$$I_c = \frac{V_I'}{X_c}(1 - \beta) \quad (11)$$

or:

$$I_c = \frac{hI_G}{X_c}(1 - \beta) \quad (12)$$

Thus, the reactance ($X_c$) of the capacitance load ($C_d$) of the detector, is changed to $X_c/(1-\beta)$. Thus the capacitance has been multiplied by the factor $(1-\beta)$. If the positive feedback is arranged to be 0.999 or greater, but still less than unity (1.0), the capacitance is reduced quite significantly. Thus $I_c$ is kept small. This condition is obtained when $h\ (1-\beta)\ C_d <<1$. This condition, thus, is compatible with that for the effective reduction of $R_L$ by the negative feedback voltage $V_f$.

The above analysis is, it is to be understood, is a heuristic approach in explaining the principle of the invention to achieve the desired feedback. The embodiments of FIGS. 4–5 illustrate several ways of achieving the positive and negative feedback to the transducer and its load. However the feedback is derived or whatever the nature or form of the amplifier following the detector and its associated single or plural FET amplifiers is, is not critical, provided the design does not degrade the frequency bandwidth established at the front end, or the NEP value established at the front end for the system. Such design procedure is well known and understood by those skilled in this art.

Thus, it will be understood that in the circuits, to be described, the positive and negative feedback voltages are applied in the same way to the transducer and its load.

In FIG. 4 as well as in FIG. 5, the transducer for converting wave energy into electrical energy is embodied as a photodiode 28 and is shown with an incident photon of energy $h\nu$ as the input light signal 10. The circuits are packaged in a known manner so that the detector-preamplifier portion "front end" (to the left of the dashed line 34) can be cooled to a temperature of 77°K while the following amplifier portions (to the right of line 34) are at a temperature of 293°K, i.e., a normal room or ambient temperature.

In FIG. 4 a field effect transistor (FET) 36 operating as a source follower serves as a "front end" preamplifier by resistor 64 connected to a negative voltage source (−V), whereby the drain (D) to source (S) voltage of FET 36 is maintained at a substantially constant voltage. Transducer 28 is connected, poled as shown, directly across the gate (G) and source (S) terminals of FET 36. The polarity of the transducer depends on the type selected as well as the polarity of the biasing sources, as well known in the art. A load resistor ($R_L$) 62 is commonly connected to the G terminal of FET 36 and the anode of transducer 28, the other terminal of the resistor 62 being connected to the output of an inverting amplifier (A) 60 over conductor 65. Input terminal 63 of amplifier 60 is connected to the source terminal (S) of FET 36. The input terminal 64 of amplifier 60 is connected to ground through a resistor $R_4$. A resistor $R_2$ is coupled across the output of amplifier 60 and the input terminal 64. A bias source resistor ($R_s$) 64 couples a negative source of voltage −V to a common terminal of the source terminal S and the cathode of transducer 28. The drain (D) of FET 36 is coupled to a substantially constant voltage source +V. The output of amplifier 60 at output terminals 45 is coupled to a follow-on amplifier, such as preamplifier (A) 43, whose output at its terminals 44 is the product of its gain (A) and the preamplifier signal output $V_s$ at terminals 45. FET 36 is arranged to be operated at nearly unity gain and can be maintained unconditionally stable by being provided with a substantially constant current source from a voltage supply comprising −V in cooperation with a constant voltage +V. The negative voltage source (−V) may be provided by a substantially constant current source coupled through a large impedance (not shown) in a manner well known in the art. The magnitude or ohmic value of ($R_s$) resistor 64 is chosen small enough to achieve an adequate bias for the FET 36 and transducer 28 and yet large enough to achieve the desired substantially unity gain. In order to provide such a resistor it is preferred that the source −V be a substantially constant current source as previously indicated. Such a current source 174 is provided for the embodiment of FIG. 5, to be described. Thus, the value of $R_s$ can be selected to be relatively small enough to provide the desired bias source and yet large enough to maintain a gain of FET 36 based on the relationship:

$$A_v = \frac{g_{fs} \times R_s}{1 + R_s \times g_{fs}} \qquad (13)$$

where $A_v$ is the gain of FET 36, $g_{fs}$ is its forward transconductance in mhos and $R_s$ is the value of resistor 64.

According to the present invention an unconditionally stable gain approaching unity but less than unity is achieved by FET 36 by providing a positive feedback voltage across the source (S) to gate (G) terminals of FET 36 to neutralize significantly any capacitance appearing at those terminals. As described more fully in the above-cited U.S. Pat. No. 3,801,933, the input capacitance as appears across the gate (G) and source (S) of FET 36 is effectively reduced by factors approaching 1,000 when the gain of the FET amplifier is operated with a gain of 0.999. Such a gain is achieved, it will be appreciated in accordance with equation 13, with an FET having a $g_{fs}$ of 5 micromhos and a resistor $R_s$ of 100K ohms.

It should be noted that the embodiments of the cited U.S. Pat. No. 3,801,933 utilize a pair of FETs whereby neutralization of both the G–S interelectrode capacitance including the capacitance of the transducer as well as the G–D interelectrode capacitance of input FET is achieved. According to the embodiment of FIG. 4 of the present invention, the single FET 36, achieves a neutralization of only the interelectrode capacitance G–S of FET 36 as well as the capacitance of transducer 28, but does not neutralize the capacitance across the gate to drain of FET 36. Accordingly, the FET must be selected for an embodiment such as here described in FIG. 4 to have a relatively insignificant or at least tolerable interelectrode capacitance. FIG. 5 to be described will illustrate an embodiment utilizing a pair of FETs.

Negative feedback voltage to the load resistance ($R_L$) 62 is provided suitably by an amplifier 60 generating a negative or inverted voltage over conductor 65 to resistor 62 which negative voltage is suitably the output voltage $V_s$ at terminal 45. The resistors $R_2$. and $R_4$ define the feedback ratio by which resistor 62 is effectively reduced by the negative feedback voltage over conductor 65. Thus, the ratio $R_2/R_4$ defines the negative feedback which develops an effective reduction of load resistor $R_4$. The magnitude of the negative feedback voltage is selected in accordance with the effective reduction of the resistor $R_L$ desired by varying the size of resistors $R_2$ and $R_4$ and selecting the gain of amplifier 60. Thus, the effective resistance of $R_L$ can be reduced, for example by a factor of 5 (in a manner to be described), whereby the effective noise voltage is affected according to the dominant source of noise. The signal current generated by transducer 28 in response to an input signal 10, induces a voltage in $R_L$ but results in the instantaneous gate voltage to be one fifth the gate voltage that would have been generated without negative feedback. Thus, the signal to noise ratio may remain fixed, as explained before, but the bandwidth, determined by the $R_LC$ ($\tau$) time constant, is enhanced without the introduction of further noise by the preamplifier FET 36.

The operation of preamplifier FET 36 develops a linear output signal $V_S$ at the terminals 45 in response to an input signal 10 of wave energy from a laser or other source noting that the provision of negative feedback to resistor 62 does not significantly affect the magnitude of $V_s$ at the low frequency. The noise equivalent power as described above remains substantially constant for all levels up to the "white" noise of the following amplifier, (e.g., amplifier 43) and the $R_L \times C/5$ time constant, for example, may be of such value as to achieve a significantly large bandwidth.

In practicing the invention, care must be taken to avoid oscillation of the system not only with respect to effects due to the positive feedback voltage that is developed to neutralize the capacitance across the gate and source of FET 36 but also with respect to the combined effect of such positive feedback and the negative feedback provided by the amplifier 60. According to control loop theory, well understood in the art, the gain of any system must be less than unity when the phase shift of amplifier 60 is 180°. Thus, it is preferred that amplifier 60 have a gain of unity or greater and yet not operate in combination with FET 36 to oscillate at a critical frequency in the desired operating band. Such oscillation can be minimized if not avoided by having the effective bandwidth of the amplifier 60 as compared to the effective bandwidth of FET 36 substantially different in range. That is, if inverting amplifier 60 provides a gain of 10, for a desired operation near unity gain of FET 36 at 1 MHz, amplifier 60 should have a bandwidth of 10 MHz to avoid oscillations.

Although the positive feedback voltage across the source (S) and gate (G) terminals of FET 36 is developed substantially independently of the negative feedback voltage through the load resistor 62, in the embodiment of the invention of FIG. 4, certain applications may result in a less than optimum reduction of the effective input capacitance as exhibited by the inherent capacitance of the transducer 28 and of the load resistance $R_L$. Nevertheless, even though the bandwidth enhancement may be not as great as desirable as determined by the $R_LC$ value, the system noise is still only affected by a controllable amount. Thus, if positive feedback reduces the gate to source input capacitance from 2 pico Farads to 0.2 pico Farads, and negative feedback reduces $R_L$ from 300M ohms to 30M ohms, the $R_LC$ value is reduced by a factor of 100 while the noise may change by a factor which depends on which noise source ($I_d$ or $I_R$) is dominant.

In this description, the noise source is being emphasized, it should be noted, because it is not usual in the art to allow noise from a source other than the primary transducer to dominate the system operation. It is because of the increased size of $R_L$ that detector noise limits the NEP performance. However when $R_L$ is chosen to make the system noisier, improved operation results due to the way in which signal, detector noise, load noise, amplifier noise, and frequency response interact.

Thus, contrary to accepted views in the art heretofore, a system including a larger $R_L$ than conventional design guidelines would dictate are not only acceptable but indeed advantageous according to the present invention whereby improved SNR as well as NEP are achieved, and, furthermore, it should be emphasized, improved bandwidth is also obtained. It will be apparent to those skilled in this art that the transducer noise is usually greater and thus dominant over the noise of the incoming light energy. It is this phenomenon that dictates the problem that is to be overcome.

It is to be noted that the FET 36 of FIG. 4 is shown, according to the convention in the art, with the arrow of the gate terminal pointing inward, as N-type. Other types of FETs may be used as desired as will be apparent to those skilled in the art, arranged in circuits to provide the positive feedback voltages in accordance with the principles of the invention described above.

Other arrangements of circuits embodying the invention may utilize a buffer amplifier for isolating or matching the impedances of the FET 36 and amplifier 60 in the form of a bipolar transistor or an FET coupled between the source of FET 36 and terminal 63 of amplifier 60.

The positive feedback should be arranged to neutralize the input capacitance as exhibited by the inherent capacitance of the transducer 28 by minimizing voltage or potential variations across that transducer 28 in response to input wave energy signals applied thereto. This is achieved as illustrated by the embodiment of FIG. 4 by the source follower action of the input FET 36. Further, the negative feedback for reducing the effective impedance of the load resistor $R_L$ is derived from a suitable negative feedback source suitably coupled to the load impedance $R_L$ which in turn is connected directly to the transducer 28 and the gate of the input FET 36.

It should be further noted that the transducer 28 is connected directly across the input gate (G) and source (S) terminals of FET 36. Accordingly, all input capacitances across those terminals including not only the stray lead and terminal capacitances, but also the inherent capacitance of the transducer are reduced by the positive feedback effect of the invention.

Another form of the invention will now be described with reference to FIG. 5. A photodiode detector 150, such as a germanium diode, is connected in circuit with a field-effect transistor (FET) 152 having gate, drain, and source terminals. The diode 150 is connected across the gate and source as shown, a load resistor $R_L$ 153 being connected between the negative terminal of the diode to the output 182 of an operational amplifier 184 over conductor 180. The amplifier 184 provides a suitable bias for resistor 153, diode 150, and the FET's 154 and 152. The source (S) terminal of the FET 152 is connected to a negative voltage supply 156 through resistor ($R_s$) 158, connected to terminal 160 of shielded housing 162. The output of the cascode amplifier 155 is provided at terminals 164 wherein the reference ground 164a is common to the negative d.c. voltage supply 164b.

A positive feedback path for the amplifier is established by the FET amplifier 154 whose drain electrode (D) is connected to positive voltage source 166 and whose source electrode (S) is connected to the drain (D) of amplifier 152 via conductor 168. The positive feedback path is provided by the source of FET 152 coupled to the gate (G) of FET 154 via conductor 170 returning to FET 152 via conductor 168.

The $R_L$ resistor 153 is usually of large ohmic value as previously explained, such as $5 \times 10^8$ ohms. A voltage of about 4 to 6 volts is provided for the source terminal of FET 152 and in cooperation with amplifier 184 establishes the bias voltage for the diode detector 150 with reference to the gate of FET 152.

The diode 150 generates a current proportional to its excitation, such as an infrared signal 151, which diode current, in turn developes a voltage across the $R_L$ resistor 153. The output of terminals 164 is proportional to the ohmic value of the resistor $R_L$. Thus, the amplifier output signal voltage at terminals 164 increases directly with increasing values of $R_L$. The output noise voltage, however, as previously described, increases as the square root of the increasing values of $R_L$. Accordingly, the signal to noise ratio, for a given signal input to diode 150 increases directly as $R_L$ increases.

In theory, increased values of $R_L$ should cause the shot noise generated by the detector 150 to be the predominate noise at the amplifier output terminals 164. However, in practice, resistor $R_L$ is usually selected to be relatively small to meet the bandwidth requirement of the detector and its following amplifier.

The effective value of resistor $R_L$ is reduced by the negative feedback voltage generated by inverting operational amplifier 184 over feedback path 181 in a manner described above with respect to FIG. 4, resistor 186 and 188 contributing to the feedback ratio as described above. It should be appreciated, as previously indicated, that the embodiment of FIG. 5 by the use of FET 154 provides a positive feedback path (170) to FET 152 to neutralize the gate to drain capacitance. The positive feedback of FET 152 neutralizes the gate-to-source capacitance as well as the capacitance of diode 150 in the manner described for FIG. 4.

The FET's 152 and 154 of FIG. 5 are typically the commercial type 2N4222A having a high pinch-off voltage, preferably, 4 to 6 volts. FET 152 operates as a source follower with a reverse bias of about 5 volts with an operating current of 140 microamps.

Instead of a passive resistor $R_s$, a dynamic impedance 174 comprising a similar type FET 180 is connected to negative voltage 157 typically 22.5 volts, via $R_1$ resistor 172, typically 39K ohms, with the terminal connections shown via lead 171 to terminal connection 160. The dynamic impedance 174, as known, provides adequate operating current at low battery voltages for the amplifier and will improve the gain characteristic so as substantially to approach unity.

The detector is typically a type M708 infrared detector. The $R_L$ resistor 153 is typically $5 \times 10^8$ ohms connected to −16.5 volts to provide the reverse bias of 5 volts on the detector diode 150. In addition to this automatic biasing arrangement, FET 152 is also reversed bias to bias thereby the detector 150.

The manner of effecting feedback may vary as indicated above. According to the invention the positive feedback is provided to divide the capacitance at the so-called "front end" of the system and the detector capacitance, and to provide the negative feedback to divide the load resistance value. There are many suitable circuit arrangements which can achieve these feedback actions as will be apparent to those skilled in this art.

It should now be noted and appreciated that by having the option of either of the noise currents $I_D$ or $I_R$ control the noise performance together with feedback, there is available the choice of providing a large response with good NEP but poor bandwidth, or a lower response with good NEP and better bandwidth. Improper choice of these options results in a degraded NEP as the bandwidth is enhanced. For example, to illustrate these options, assume a system with a NEP of $10^{-13}WHz^{-1/2}$. The limiting noise current ($I_R$) is $7.42 \times 10^{-14}A$, using the quantum efficiency of 0.65 at $\lambda 1.42 \mu m$, as previously described, but for this system, however, this limitation fixes the load resistance $R_L$ at 19.2Mohm. Further assume a detector with a leakage current $I = 10^{-11}A$. Thus, the noise current of the detector $I_D = 1.79 \times 10^{-15}A$, as discussed above in developing the use of equation (1). Assume now a power flux of $10^{-12}W$ be applied to the detector. Hence SNR is 10 for the amplifier of FIG. 1 since the signal voltage, $V_s$ is 57.1 $\mu V$ and the noise voltage, $V_n$ is 5.71 $\mu V$. But with the circuit of FIG. 4 provided with a negative feedback factor of 5, the SNR is 2 since $V_s$ is 11.4 $\mu V$ and $V_n$ is still 5.71 $\mu V$ as established by $R_L$.

Now assume that the limiting noise sources are exchanged. Thus, $I_D$ will be the dominating source of noise rather than $R_l$. For a load resistor $R_L$ = 500M ohms, $I_R$ is $2.91 \times 10^{-15}A$. Note that, the detector leakage current (I) now becomes $I = 1.72 \times 10^{-8}A$ to make the detector noise current $I_D = 7.42 \times 10^{-14}A$. It should be noted that because of the large value of $R_L$ selected, the performance of the detector in terms of its leakage current I may be relatively poor as indicated by the value of I used in this example. Again the incident power flux is $10^{-12}W$. Hence SNR is 10 for the amplifier of FIG. 1 since $V_s$ is $3.71 \times 10^{-4}V$ and $V_n$ is $3.71 \times 10^{-5}V$. With the circuit of FIG. 4 provided with a negative feedback factor of 5, the SNR becomes 9.8 since $V_s$ is now $7.42 \times 10^{-5}V$ and $V_n$ is 7.57 $\mu V$. The total output noise voltage is the rms value of $V_n$ and ($I_R R_L$).

Assume the same examples but this time use a negative feedback factor of 2. In the first case of a dominant load resistor noise, the SNR becomes 5 since $V_s$ is now 28.5 $\mu V$ and $V_n$ is still 5.71 $\mu V$ when feedback is applied; in the second case $V_s$ is now $1.85 \times 10^{-4}V$ and $V_n$ is $1.85 \times 10^{-5}V$ so that SNR is still 10.

Thus, it will be apparent from these numerical examples that design trade-offs of SNR, bandwidth, and NEP can be made by one skilled in the art. The usual prior art trade-off involves only bandwidth and signal, in which noise has a secondary role, these prior art systems however are being used at the limit of their noise capability as well as frequency capability.

The invention is useful in systems comprising lasers as the source of input light energy. An erbium laser emits a wavelength ($\lambda$) of 1.50 – 1.58 micrometers. A conventional germanium photodiode system is too slow to detect easily pulses at megahertz bandwidths without using an intense laser source and equalization. With the feedback arrangement of FIG. 4, a flat frequency bandwidth to perhaps 50 kHz can be attained and still achieve $10^{-14}W\ Hertz^{-1/2}$ or better for the NEP. Then it becomes a simple procedure as will be apparent to those skilled in this art to trade-off NEP with frequency response by means of an equalizing network to allow the attainment of 10 megahertz or higher (a practical pulse rate in this art) at a low noise level. Such a trade-off does not affect the SNR or the NEP until the noise of the following amplifier becomes significant. The laser-detector system (transmitter-receiver) can then be used by one skilled in the art over larger ranges than heretofore, since the drop in signal level is not as great as would be the case when the starting frequency for equalization was lower. The power levels for the laser can be considerably diminished allowing very significant size and weight reduction of the laser apparatus.

The conventional pyroelectric detector has a $1/f$ frequency response and a half-power frequency that is higher than that of the germanium photodiode. According to the present invention, the frequency response of a pyroelectric detector can be enhanced by the same technique so that much higher frequency information will be measured with no charge in the SNR.

Hydrophones and microphones also have as their dominant electric impedance a capacitance. When such a transducer is used with the positive and negative feedback arrangement of this invention, enhanced frequency response results and the SNR remains constant until the noise level of the following amplifier is reached by the falling system "front end" noise characteristic.

Silicon photodiodes also have the same basic frequency limitation when used in systems wherein SNR's are such as to demand low noise and as such can have enchanced frequency response and without degrading the noise performance of the system by combining the silicon photodiode detector with positive and negative feedback according to the invention.

What is claimed is:

1. A system for amplifying wave energy signals comprising:

a field effect semiconductor device having a gate, drain, and source electrode, a two terminal transducer for generating an electrical current in response to receipt of said wave energy, one terminal being connected to said gate electrode and the other terminal being connected to said source electrode of said device, said transducer having inherent capacitance, a biasing impedance connected between a substantially constant voltage source and said source electrode of said device, said biasing impedance and said constant voltage source being arranged to operate said field effect semiconductor device in an unconditionally stable state at a gain approaching but less than unity, whereby, in response to said electric current, an electrical potential is developed at said gate electrode that is substantially the same as the electrical potential at the source of said device and said inherent capacitance of said transducer is significantly neutralized to a substantially negligible value.

an amplifier coupled to said source electrode of said device for generating a negative feedback voltage in response to said electric current of said transducer, a two terminal load impedance having one terminal connected directly to said gate electrode of said device and the other terminal coupled to said negative feedback amplifier, said two terminal load impedance having an appropriately large ohmic value to maintain a large signal-to-nose ratio, whereby said negative feedback voltage effectively reduces the ohmic value of said two terminal load impedance, and output means coupled to said negative feedback amplifier for providing a system output signal in response to the receipt of said wave energy by said transducer, whereby said system is responsive with a substantially constant signal-to-noise ratio to said wave energy signals by neutralizing substantially said capacitance of said transducer while effectively reducing the ohmic value of said load impedance, said wave energy having a significant bandwidth.

2. A signal translating circuit responsive to wave energy signals comprising:

a pair of field-effect semiconductor devices each having a gate, drain, and source electrode, input means coupled to the source and gate of one of said devices, said input means including a transducer generating an electrical current in response to receipt of said wave energy and a two terminal load impedance coupled to receive said electrical current from said transducer, said transducer exhibiting capacitance to said source and gate electrodes of said one device, the source electrode of said one of said devices being coupled to the gate electrode of the other of said devices.

the drain electrode of said one device being connected to said source electrode of said other device providing thereby a common connection, means providing an electrical potential at said source electrode of said one device which is substantially the same as the electrical potential at said gate electrode of said other device and including a biasing impedance connected between a substantially constant voltage source and said source electrode of said one device, said biasing impedance and said constant voltage source being arranged to operate both of said field effect semiconductor devices in an unconditionally stable state at a gain approaching but less than unity, whereby, in response to said electrical current, an electrical potential is developed at said gate electrode of said one device that is substantially the same as the electrical potential at the source of said one device and said inherent capacitance of said transducer is significantly neutralized to a substantially negligible value, wherein, in response to said wave energy the difference in electrical potential between said source and gate electrodes and said gate and said drain electrodes of said one device respectively is substantially zero, to thereby substantially reduce the input capacitance between said source and said gate electrode of said one device and the stray capacitance between said gate and drain electrode of said one device, an amplifier coupled to the common connection of said one device drain electrode and said other device source electrode for generating a negative feedback voltage in response to said electric current of said transducer, said two terminal load impedance having one terminal connected directly to said gate of said one device and the other terminal of said impedance coupled to said negative feedback amplifier, said impedance having an appropriately large ohmic value to maintain a large signal-to-noise ratio, whereby said negative feedback voltage effectively reduces the ohmic value of said two terminal load impedance, output means coupled to said negative feedback amplifier for providing a system output signal in response to the receipt of said wave energy by said transducer, whereby said system is responsive to said wave energy signals with a substantially constant signal-to-noise ratio by neutralizing substantially said capacitance of said transducer while effectively reducing the impedance value of said load impedance, said wave energy having a significant bandwidth.

3. An amplifier system according to claim 2 wherein said wave energy signals are acoustical and said transducer is a hydrophone.

4. An amplifier system according to claim 2 wherein said wave energy signals are acoustical and said transducer is a microphone.

5. An amplifier system according to claim 2 wherein said wave energy is electromagnetic radiation and said transducer is a silicon photodiode.

6. An amplifier system according to claim 2 wherein said wave energy is electromagnetic radiation and said transducer is a germanium photodiode.

7. An amplifier system according to claim 2 wherein said wave energy is electromagnetic radiation and said transducer is a pyroelectric detector.

8. An amplifier system according to claim 2 wherein said wave energy is electromagnetic radiation and said transducer includes means to respond to pulses from an eribium laser.

* * * * *

UNITED STATES PATENT AND TRADEMARK OFFICE
CERTIFICATE OF CORRECTION

PATENT NO. : 3,927,383

DATED : December 16, 1975

INVENTOR(S) : Earl John Fjarlie et al.

It is certified that error appears in the above-identified patent and that said Letters Patent is hereby corrected as shown below:

Title Page, change "[73] Assignee: RCA Corporation, New York, N.Y." to --[73] Assignee: RCA Limited, Quebec, Canada--.

Signed and Sealed this

*Twenty-seventh* Day of *November 1979*

[SEAL]

*Attest:*

RUTH C. MASON
*Attesting Officer*

LUTRELLE F. PARKER
*Acting Commissioner of Patents and Trademarks*